United States Patent
Lekavicius et al.

(10) Patent No.: US 12,184,259 B2
(45) Date of Patent: Dec. 31, 2024

(54) ETCHING AND THINNING FOR THE FABRICATION OF LITHOGRAPHICALLY PATTERNED DIAMOND NANOSTRUCTURES

(71) Applicant: University of Oregon, Eugene, OR (US)

(72) Inventors: Ignas Lekavicius, Eugene, OR (US); Hailin Wang, Eugene, OR (US)

(73) Assignee: University of Oregon, Eugene, OR (US)

( * ) Notice: Subject to any disclaimer, the term of this patent is extended or adjusted under 35 U.S.C. 154(b) by 458 days.

(21) Appl. No.: 17/466,979

(22) Filed: Sep. 3, 2021

(65) Prior Publication Data

US 2021/0399708 A1    Dec. 23, 2021

Related U.S. Application Data

(63) Continuation of application No. PCT/US2020/021547, filed on Mar. 6, 2020.

(60) Provisional application No. 62/814,822, filed on Mar. 6, 2019.

(51) Int. Cl.
    *H03H 9/02*    (2006.01)
    *G03F 7/004*   (2006.01)
    *G03F 7/20*    (2006.01)

(52) U.S. Cl.
    CPC ....... *H03H 9/02055* (2013.01); *G03F 7/0042* (2013.01); *G03F 7/2035* (2013.01)

(58) Field of Classification Search
    None
    See application file for complete search history.

(56) References Cited

U.S. PATENT DOCUMENTS

| | | | |
|---|---|---|---|
| 5,580,687 A * | 12/1996 | Leedy | H01L 21/764 257/E25.011 |
| 5,830,605 A | 11/1998 | Umeki et al. | |
| 9,934,981 B2 * | 4/2018 | Sherman | H01J 37/32422 |
| 2002/0014673 A1 * | 2/2002 | Leedy | H01L 25/0652 257/419 |
| 2003/0223535 A1 * | 12/2003 | Leedy | H01L 25/50 257/E21.705 |
| 2008/0157283 A1 * | 7/2008 | Moslehi | H01L 31/046 257/E27.125 |

(Continued)

OTHER PUBLICATIONS

International Search Report and Written Opinion issued for International Application No. PCT/US2020/021547 on Jul. 13, 2021.

(Continued)

*Primary Examiner* — Allan W. Olsen
(74) *Attorney, Agent, or Firm* — Klarquist Sparkman, LLP

(57) ABSTRACT

A back side of a diamond or other substrate is thinned using plasma etches and a mask situated away from the back side by a spacer having a thickness between 50 μm and 250 μm. Typically, a combined RIE/ICP etch is used to thin the substrate from 20-40 μm to less than 1 μm. For applications in which color centers are implanted or otherwise situated on a front side of the diamond substrate, after thinning, a soft graded etch is applied to reduce color center linewidth, particularly for nitrogen vacancy (NV) color centers.

15 Claims, 5 Drawing Sheets

(56) References Cited

U.S. PATENT DOCUMENTS

| | | | | |
|---|---|---|---|---|
| 2010/0048001 A1* | 2/2010 | Harikai | ............... | H01L 21/308 |
| | | | | 438/464 |
| 2010/0140669 A1* | 6/2010 | Xie | .................... | B81C 1/00246 |
| | | | | 438/700 |
| 2010/0148283 A1* | 6/2010 | Shih | ................. | H01L 27/14689 |
| | | | | 438/618 |
| 2016/0348277 A1 | 12/2016 | Markham et al. | | |
| 2021/0311229 A1* | 10/2021 | Her | .................. | H01J 37/32715 |

OTHER PUBLICATIONS

Connors et al., "Chamber conditioning process development for improved inductively coupled plasma reactive ion etching of GaAs/AlGaAs materials," *Journal of Vacuum Science & Technology B*, 31(2): 021207 (Feb. 2013).

Oliveira et al., "Effect of Low-Damage Inductively Coupled Plasma on Shallow NV Centers in Diamond," *Applied Physics Letters*, 107(7): 073107 (Aug. 2015).

Oo, "Coupling Nitrogen Vacancy Centers in Diamond to a Nanomechanical Oscillator," available at https://api.semanticscholar.org/CorpusID:103477590, 132 pages (Sep. 2017).

Lekavicius et al., "Diamond Phononic Crystal Spin-Mechanical Resonators with Spectrally-Stable Nitrogen Vacancy Centers," arXiv: 1905.01251, 18 pages (May 2019).

\* cited by examiner

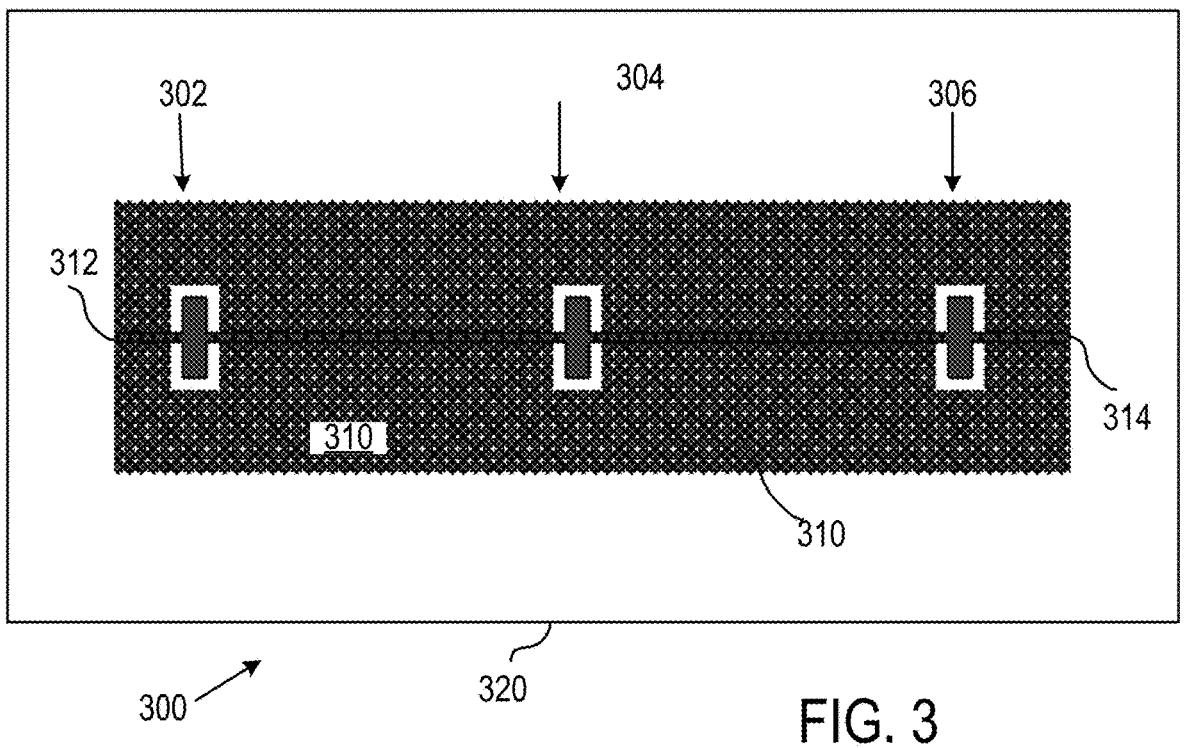
FIG. 3
FIG. 4
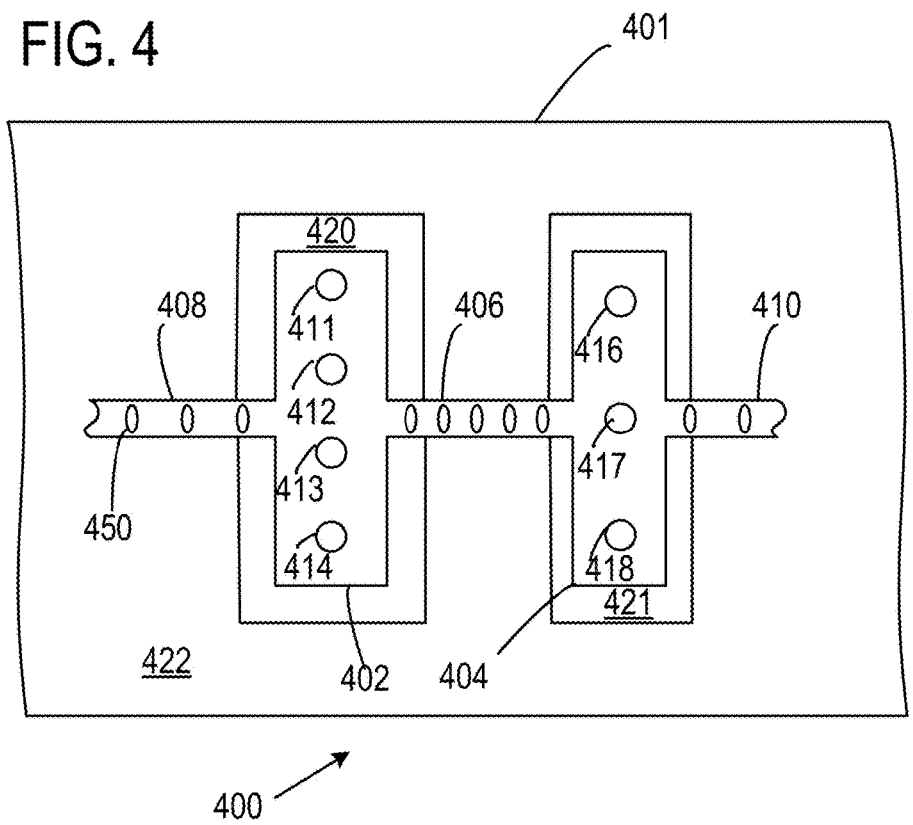

ETCHING AND THINNING FOR THE FABRICATION OF LITHOGRAPHICALLY PATTERNED DIAMOND NANOSTRUCTURES

CROSS REFERENCE TO RELATED APPLICATIONS

This application is a continuation of International Application No. PCT/US2020/021547, filed on Mar. 6, 2020, which claims the benefit of U.S. Provisional Application No. 62/814,822, filed Mar. 6, 2019, each of these prior applications is incorporated herein by reference in its entirety.

ACKNOWLEDGMENT OF GOVERNMENT SUPPORT

This invention was made with government support under contracts 1719396, 1604167, 1606227, and 1641084 awarded by the Air Force Office of Scientific Research (AFOSR) and the National Science Foundation (NSF). The government has certain rights in the invention.

FIELD

The disclosure pertains to processing of substrates, particularly diamond substrates that include NV centers.

BACKGROUND

A spin-mechanical resonator, in which an electron spin couples to a mechanical mode with a high Q-factor, provides an experimental platform for quantum control of both spin and mechanical degrees of freedom and for exploiting mechanical degrees of freedom for quantum information processing. Most of the experimental studies on spin-mechanical resonators have employed diamond based mechanical systems and have used negatively charged nitrogen vacancy (NV) centers in diamond as a spin system.

In many applications that use diamond substrates and NV centers, thin diamond layers are needed and surfaces at which NV center are defined should exhibit minimal surface damage. For very thin diamond layers, any non-uniformity produced during thinning can result in weak or broken diamond films. During some processing operations, substrate surfaces are damaged, resulting in excessive spectral linewidths of the NV centers. For at least these reasons, improved approaches are needed.

SUMMARY

Methods of processing substrates, particularly diamond membranes and devices using such membranes, are disclosed. The disclosure generally pertains to thinning and etching of diamond substrates to achieve satisfactory thickness uniformity in thin substrates (less than 1 µm, 750 nm, 500 nm, 400 nm, 300 nm, 250 nm, 200 nm, 150 nm, or 100 nm thick) and to process the thinned (back side surfaces) to improve linewidths of nitrogen vacancy centers or silicon vacancy centers implanted in the diamond substrates.

According to some examples, methods of thinning a diamond substrate comprise situating a mask to be displaced from a back side of the diamond substrate, the mask defining an aperture corresponding to an area of the back side of the substrate to be thinned. The back side of the substrate is exposed to an etch through the aperture defined in the mask. In some cases, the etch is one or more of a reactive ion etch (RIE) and an inductively coupled plasma (ICP) etch, and in further examples, at least a portion of the etch includes a simultaneous RIE and ICP etch. In more examples, a phononic crystal is defined on a front side on the diamond substrate and a plurality of surface mechanical resonators (SMRs) is defined on the front side of the diamond substrate, wherein the SMRs including one or more color centers such as nitrogen vacancy (NV) centers or silicon vacancy (SiV) centers, or a combination thereof. In other examples, the mask is displaced from the back side of the diamond substrate a distance of between 50 µm and 250 µm during back side etching. In typical examples, a spacer is situated between the mask and the back side of the diamond substrate so that the mask is displaced from the back side of the diamond substrate, and the spacer has a thickness of between 50 µm and 250 µm. In a typical example, the mask is defined in a sapphire substrate, metal, quartz, or other substrate.

Methods comprise thinning a back side of a diamond substrate and applying a graded soft etch to the thinned back side of the diamond substrate. In some examples, nitrogen vacancy (NV) centers are formed on the front side of the diamond substrate, and the graded, soft etch is applied to the thinned back side of the diamond substrate to reduce a linewidth associated with the NV centers. In some embodiments, the graded soft etch is a stepwise graded etch and includes at least an initial etch step having an etch rate of at least 5 nm/min.

In representative examples, the graded, soft etch is a stepwise graded inductively coupled plasma (ICP) $O_2$ etch including at least an initial etch step at an initial ICP power level to produce an initial etch rate greater than 5 nm/min applied for an initial exposure time of at least 30 minutes and a final etch step at a final ICP power level that is less than ⅓ of the initial power level applied for a final exposure time of less than 15 minutes. In other examples, the stepwise etch further comprises a first etch step applied after the initial etch step state, the first etch step associated with a first power level and a first etch rate of less than ¼ of the initial etch rate for a first exposure time of less than ½ of the initial exposure time. In still other examples, the stepwise etch further comprises a second etch step applied after the first etch step state and prior to the final etch step, the second etch step associated with a second power level and a second etch rate that is less than the first etch rate for a second exposure time of less than ½ of the first exposure time. According to typical embodiments, the graded, soft etch is a stepwise graded ICP $O_2$ etch that includes a series of etch steps associated with decreasing ICP powers.

Devices comprise a diamond membrane of thickness that is less than 1 µm and a plurality of nitrogen vacancy (NV) centers situated at a front side of the diamond membrane, wherein a linewidth of the NV centers is less than 330 MHz. In some examples, the devices include a phononic lattice situated on the front side of the diamond membrane and coupled to the NV centers. In other examples, the thickness of the diamond membrane is less than 500 nm.

The foregoing and other features, and advantages of the disclosed technology will become more apparent from the following detailed description, which proceeds with reference to the accompanying figures.

BRIEF DESCRIPTION OF THE DRAWINGS

FIG. 3 illustrates spin mechanical resonators (SMRs) defined in a diamond membrane having a back side that is thinned and/or processed with a graded soft etch along with a phononic crystal defined on a front side FIG. 4 illustrates a quantum computing substrate that includes two SMRs defined on a diamond substrate that is processed as disclosed herein.

DETAILED DESCRIPTION

Figure 1:
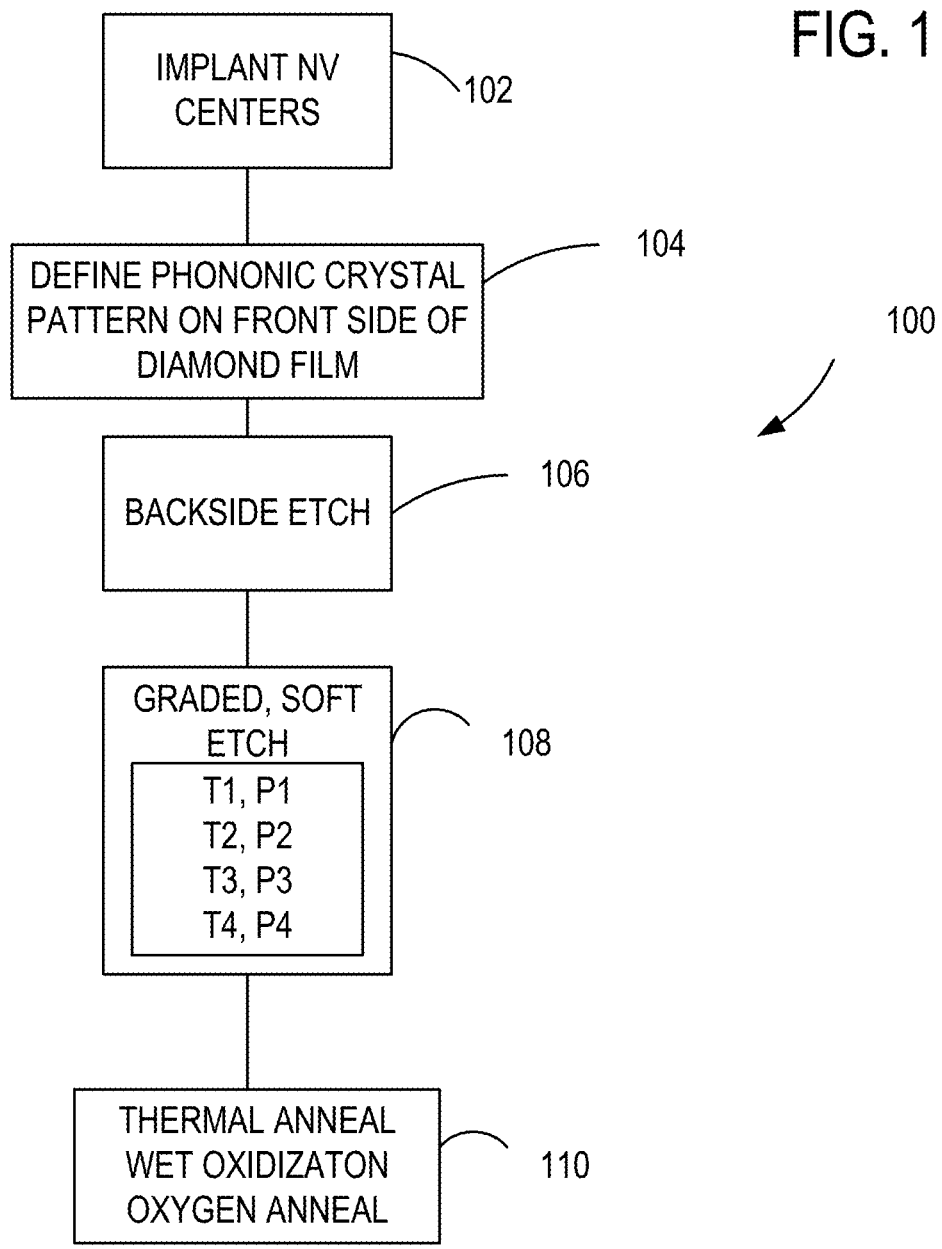
FIG. 1 illustrates a representative processing method that includes a graded, soft etch.

Negatively charged nitrogen vacancy (NV) centers are promising spin qubits for quantum information processing. These defect centers feature long decoherence times for electron and nuclear spins, along with high-fidelity optical state preparation and readout. Major technical hurdles that have hindered the use of NV centers in a variety of quantum devices, including spin-mechanical systems and optical microcavities, are the severe degradation of optical properties of NV centers in a thin diamond membrane and the ability to suitably thin the thick diamond materials used as substrates. Optical linewidths of NV centers in high purity (i.e., electronic grade) bulk diamond range from a few tens to a few hundred MHz at low temperature (~10 K or below) and can broaden to 1 GHz or more for NV centers in diamond membranes with a thickness less than 1 µm. Thick diamond substrates must be uniformly thinned to achieve such thin membranes to avoid membrane breaks, cracks, and other structural defects.

The processes used in fabricating thin diamond membranes, such as reactive ion etching (RIE), can cause extensive surface damage. This surface damage cannot be repaired adequately with conventional or established surface treatment processes. NV centers, which feature permanent electric dipoles, are highly sensitive to charge fluctuations on the surface of the membrane, even when a surface is far away (e.g., 1 µm) from the NV centers. Excessive charge fluctuations in the damaged surface layers lead to strong spectral fluctuations of the NV optical transition frequency (i.e., spectral diffusion), resulting in large optical linewidths.

Disclosed herein are approaches that can be effective in removing defective surface layers and uniformly etching diamond substrates to form thin (~1 µm or less) membranes. With suitable use of a mask during a thinning process, trenching and other surface non-uniformities can be reduced or eliminated. For convenience, the disclosed etching processes that permit reduction of surface damage are referred to herein as graded, soft etching processes. In such processes, an etch rate is generally decreased continuously or stepwise, for example, from 50, 40, 30, 20, 10, or 5 nm/minute to significantly below 1 nm/minute as etching progresses. In one example, an initial etch rate of about 6 nm/minute is used. Soft etching as used herein generally refers to inductively coupled plasma (ICP) etching using $O_2$. By contrast, hard etches as used herein refer to reactive ion etching (RIE) in which an electrical potential accelerates an etching species into a substrate. Such hard etches can damage substrate surfaces. When used in membranes that include nitrogen vacancy (NV) centers, such damage results in considerable line broadening of the NV centers. Devices that include silicon vacancy (SiV) centers typically do not exhibit significant line broadening due to surface damage, but still require careful back side thinning of diamond substrates.

Example 1

Figure 2A:
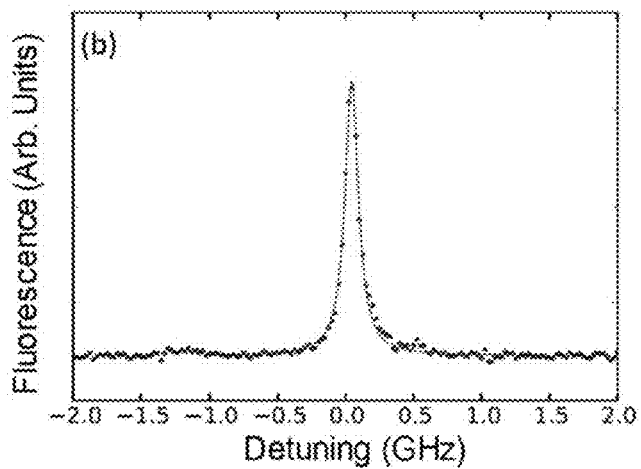
FIGS. 2A-2C are photoluminescence excitation (PLE) spectra of a typical NV center in a diamond bulk film after the etching of a phononic crystal pattern (FIG. 2A), after RIE backside thinning (FIG. 2B), and after a graded, soft $O_2$ etch (FIG. 2C).

In a typical method 100 illustrated in FIG. 1, at 102, an electronic grade bulk diamond film of thickness of about 30 µm is implanted with NV centers about 100 nm beneath a front surface. Standard implantations and surface treatments can be used for the formation of the NV centers. At 104, a phononic crystal pattern is etched on the front side with $O_2$ RIE etching using $Si_3N_4$ as a hard mask. FIG. 2A shows a photoluminescence excitation (PLE) spectrum of a typical NV center in the diamond bulk film after the etching of the phononic crystal pattern, but before a backside thinning process. An average optical linewidth is measured as 115 MHz, which indicates that the frontside etching process induces minimal damages on the diamond surface, likely due to protection by the $Si_3N_4$ hard mask.

Figure 2B:
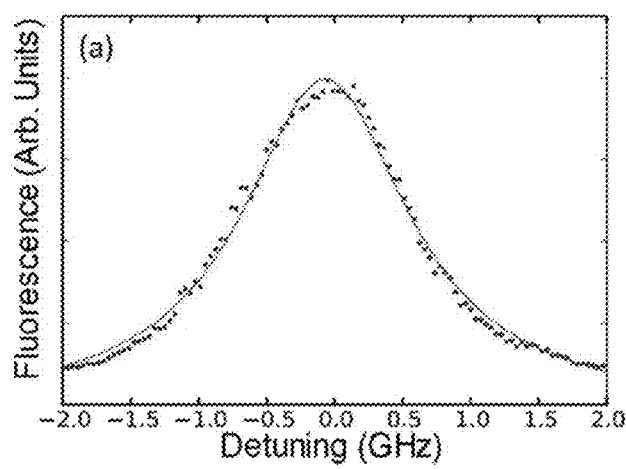

At 106, the diamond film is thinned from the backside to a thickness near 1 µm with an RIE process for several hours. After this RIE process, the photoluminescence excitation (PLE) spectrum of a typical NV center is as shown in FIG. 2B. Optical linewidths of NV centers after this RIE process exceed 1 GHz.

Figure 2C:
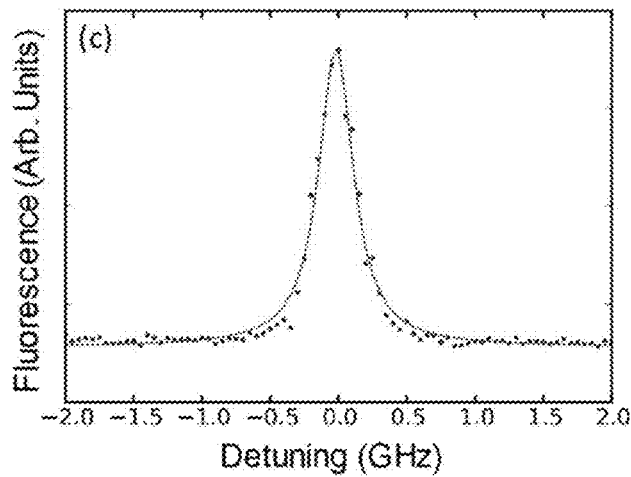

At 108, a so-called graded, soft etch is applied that can improve NV center linewidth. In one example, a graded soft etch is a graded, inductively coupled plasma (ICP) $O_2$ etch having four steps, each associated with respective power levels (P1, P2, P3, P4) and exposure durations (T1, T2, T3, T4). Typically, P1>P2>P3>P4 and T1>T2>T3>T4. In a particular example, T1=1 hr, P1=500 W (etch rate of about 6 nm/minute), T2=1 hr, P2=200 W (etch rate of about 1 nm/minute), T3=10 min, P3=150 W, and T4=10 min, and P4=100 W. This graded soft $O_2$ etching process aims to remove the damaged surface layers, while avoiding additional damage through a gradual decrease in the etch rate. Fewer or more steps can be used and etch power can be decreased continuously as well as in steps. Some steps can use the same exposure times or all steps can use different exposure times. A typical photoluminescence excitation (PLE) spectrum of a typical NV center after the graded, soft $O_2$ etch is shown in FIG. 2C.

The graded soft $O_2$ etch is followed by step-wise thermal annealing, triacid wet chemical oxidation, and oxygen annealing at 110, similar to processes used in the creation of NV centers following ion implantation. After these extensive surface treatments, NV linewidths as small as 330 MHz in diamond nanomechanical resonator with thickness<1 µm can be obtained as shown in FIG. 2C. Exposure durations and plasma powers can be adjusted to step down the etch rate to achieve even narrower optical linewidths for NV centers.

The use of a graded etching process permits realization of narrow NV optical linewidths. It appears that the initial relative fast soft etching process removes damaged layers, which can be as thick as a few hundred nanometers. A subsequent relatively slow etching process appears to reduce and remove additional damage produced the initial rapid soft etching process. While the initial soft $O_2$ etch can reduce damage on the diamond surface, this fixed etch produces additional damage that can be addressed by a graded soft etch.

Example 2

FIG. 3 illustrates a quantum computing substrate 300 that includes spin-mechanical resonators (SMRs) 302, 304, 306 coupled by tuned acoustic waveguides and defined on a diamond substrate 320 that is thinned on a substrate back side at least at portions corresponding to the SMRs 302, 304, 306. NV or SiV centers can be provide on a front side (device side) of the substrate at the SMRs. Additional SMRs can be provided and coupled to acoustic waveguides 312, 314. A phononic crystal structure 310 is situated about the SMRs 302, 304, 306 and is selected to have a band gap so that acoustic frequencies used in coupling between SMRs (as communicated by acoustic waveguides) and within SMRs do not propagate in the phononic crystal structure 310. Each of the SMRs 302, 304, 306 is situated in a keepout area in which a membrane (such as a diamond membrane) in which SMRs and/or acoustic waveguides are defined is removed or substantially thinned as disclosed herein.

FIG. 4 illustrates a substrate 400 that includes a diamond membrane 401 on which a phononic crystal 422 is defined. Portions of the diamond membrane are thinned and processed with a soft, graded etch as disclosed herein. SMRs 402, 404 are coupled by an acoustic waveguide 406 and to additional SMRs via acoustic waveguides 408, 410. The SMRs 402, 404 include NV centers 411-414 and 416-418 respectively, but fewer or more NVs can be provided. The SMRs 402, 404 can have the same or similar dimensions. The acoustic waveguide 406 permits coupling at an acoustic frequency (or multiple acoustic frequencies) that correspond to resonance frequencies of both SMRs 402, 404. Acoustic waveguide band gap and permitted frequencies are established using one or more sets of holes or other apertures 450, thinned or thickened waveguide portions, or other periodic or multiply periodic variations in acoustic impedance. Each of the SMRs 402, 404 is situated in a respective keepout region 420, 421 to reduce or eliminate unwanted acoustic coupling. Additional details of such structures can be found in U.S. patent application Ser. No. 16/293,555, which is incorporated herein by reference.

Example 3

Figure 5A:
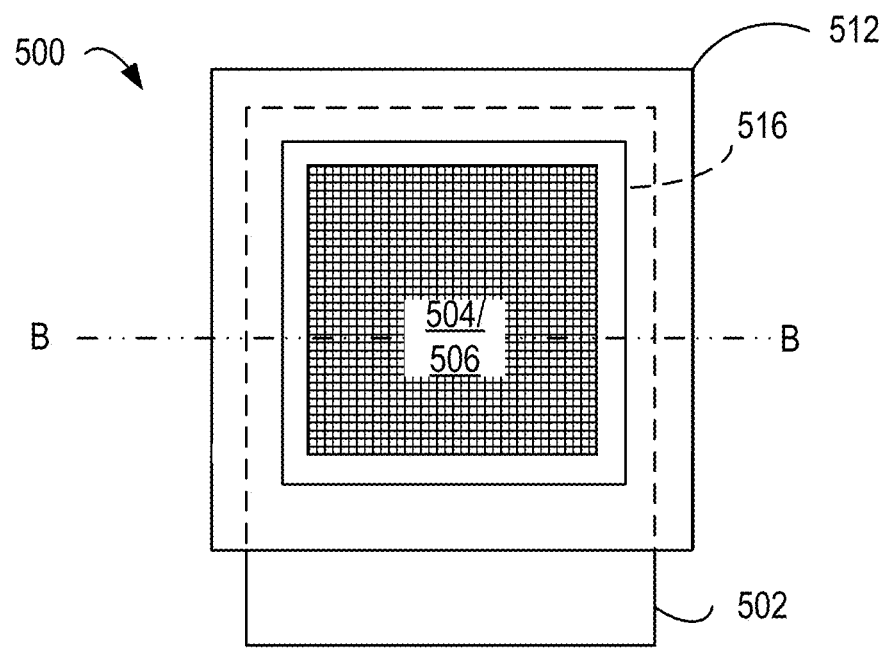
FIG. 5A is a plan view of a substrate and a spaced apart mask situated for exposing a surface of the substrate to an etch process.
Figure 5B:
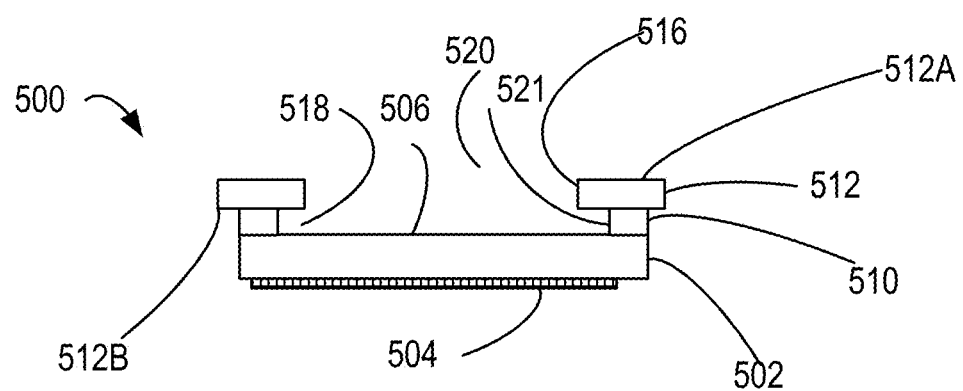
FIG. 5B is a sectional view of the assembly of FIG. 5A.

Referring to FIGS. 5A-5B, a diamond substrate 502 includes major surfaces 504, 506 referred to herein as a device side and a back side, respectively. One or more devices are defined on the device side 504, such a phononic devices and structures and NV centers. In typical applications device fabrication is largely performed on relatively thick diamond substrates and then thinned to realize intended device performance. A spacer 510 is situated at the back side 506 and serves to space a mask 512 (referred to herein in some cases as a shadow mask) away from the diamond substrate 502. The mask 512 defines an aperture 520 corresponding to an area of the diamond substrate 502 that is to be thinned. The aperture 520 can be produced by, for example, laser cutting a mask substrate such as a sapphire slide of thickness 150 µm. The aperture 520 is bordered by a sidewall 516 that is substantially perpendicular to major surfaces 512A, 512B of the mask 512. Spacing the mask 512 apart from the substrate 502 by a gap 518 avoids trenching and other surface non-uniformities during etching. The gap 518 can extend underneath the aperture sidewall as well. In one example, the spacer 510 had a thickness of 150 µm and dimensions of the aperture 520 were 1.5 mm by 0.75 mm Typically, the mask 512 is spaced 25 µm, 50 µm, 75 µm, 100, µm, 125 µm, 150 µm, 200 µm, 250 µm, 300 µm, 350 µm, 400 µm, 450 µm, or 500 µm from the back side 506 of the diamond substrate 502. In some examples, a sidewall 521 of the spacer 510 is set back from the sidewall 516 by 5, 10, 25, 50, 100, 250, 500, or 100 µm, or 0.1, 0.2, 0.5, 1.0, 1.5, or 2.0 times a thickness of the spacer 510.

Figure 5C:
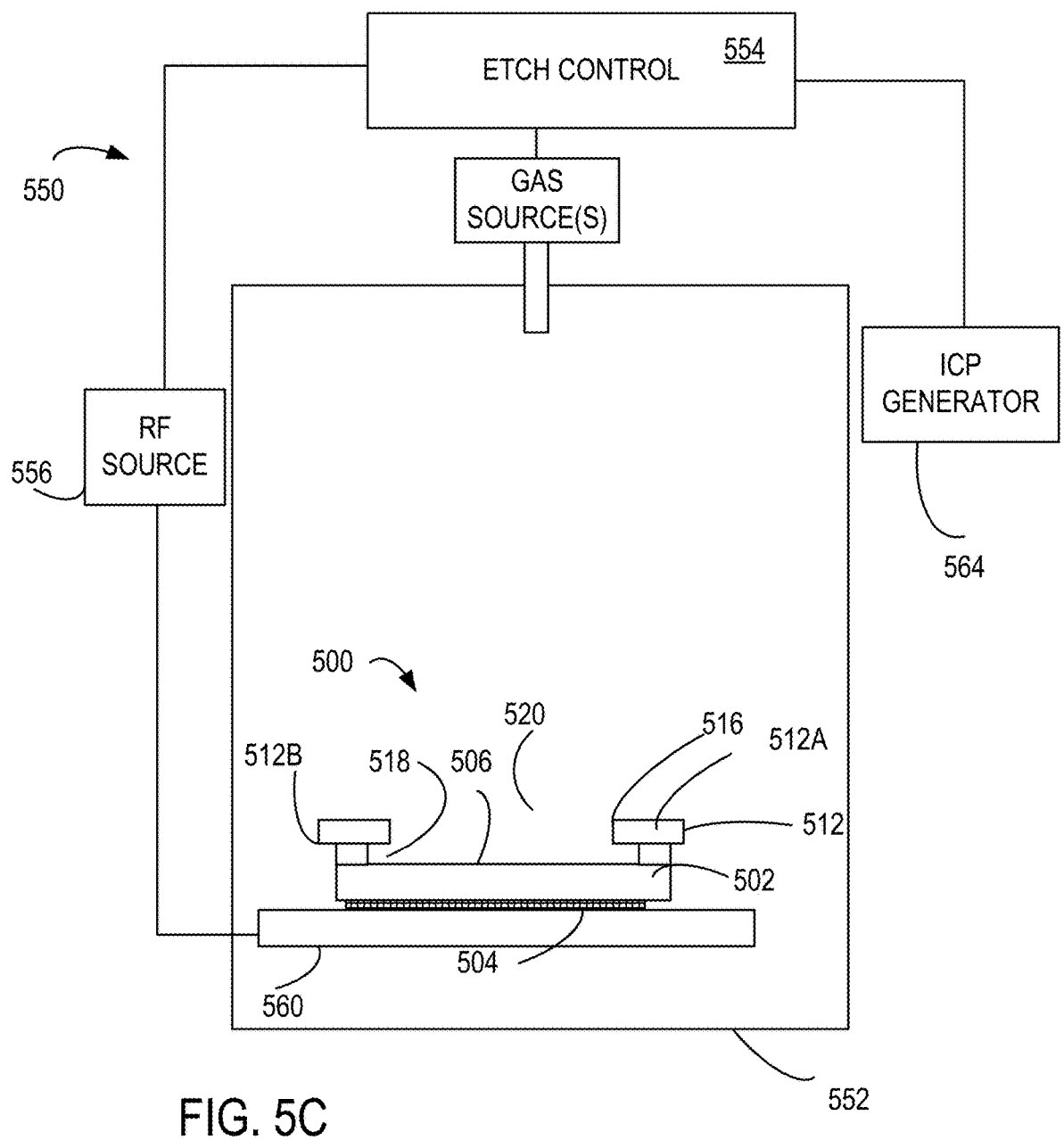
FIG. 5C illustrates the assembly of FIGS. 5A-5B situated for inductively coupled plasma etching (ICP), reactive ion etching (RIE), or other etch processing.

Referring to FIG. 5C, an etching system 550 includes a chamber 552 that receives a mask/spacer/substrate assembly 500 shown in FIGS. 5A-5B for etching using RIE or ICP or a combination thereof. An etch controller 554 is coupled to an RF source 556 that is in turn coupled to a substrate electrode 560. Using the RF source 556, a plasma can be generated. The substrate electrode is provided with bias voltage so that ions are accelerated toward a sample to be etched, which can produce a hard etch that is fast and directional. An ICP generator 564 is also coupled to the etch controller 554 and is operable to produce a plasma using an inductive coil. ICP etching is associated with a lower sample DC bias voltage (typically, no applied bias) which can result in lower etch rates but reduced sample damage. As shown in FIG. 5C, RIE and ICP can be selected as desired. In one example, a diamond substrate can be thinned from a back-side with an alternating etch process that consists of 30 min of Ar/Cl$_2$ plasma etching, with an etching rate of 80 nm/min, and 2 min of O$_2$ plasma etching, with an etching rate of 100 nm/min, followed by 10 min of soft O$_2$ plasma etching, with an etching rate of 6 nm/min. In this example, Ar/Cl$_2$ plasma etching uses an RF power of 210 W, an ICP power of 280 W, a DC bias of 310 V, a chamber pressure of 5 mTorr, and flow rates of 16 sccm for Cl$_2$, and 10 sccm for Ar. The parameters for the O$_2$ plasma etching can be the same as use for fabrication steps on the front side of the diamond substrate. For soft O$_2$ plasma etching, the DC bias is set to zero and the RF power is turned off. Other parameters include an ICP power of 500 W, a chamber pressure of 10 mTorr, and an O$_2$ flow of 30 sccm. This thinning process can be continued until, for example, a phononic structure defined on the diamond membrane is released or suspended. This is followed by a graded soft etch as disclosed above having a long period of soft O$_2$ plasma etching with gradually decreasing etching rates. As noted above, the graded soft O$_2$ etch decreases NV center linewidth and appears to do so by removing surface layers damaged by Ar/Cl$_2$ plasma and hard O$_2$ plasma etching.

General Considerations

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved.

Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus are referred to as "lowest", "best", "minimum," or the like. It will be appreciated that such descriptions are intended to indicate that a selection among many used functional alternatives can be made, and such selections need not be better, smaller, or otherwise preferable to other selections. Examples are described with reference to directions indicated as "above," "below," "upper," "lower," and the like. These terms are used for convenient description, but do not imply any particular spatial orientation.

In some examples, the disclosure pertains to phononic waveguides that are situated to provide directional transfer of quantum states between spins in separate spin-mechanical resonators (SMRs) as well as permit internal transfer within SMRs. Quantum state transfer can be made immune to thermal mechanical noise in the phononic waveguides. Interconnection of such spin-mechanical waveguides can provide scalable spin-based quantum computers. As used herein, a spin-mechanical resonator includes a spin-based qubit having quantum states associated with spin and a mechanical structure having associated mechanical resonances. In the disclosed examples, spin qubits are implemented as nitrogen-vacancy (NV) centers in diamond. Such NV centers are based on a nitrogen substitution for a carbon along with an adjacent missing carbon. Other quantum systems can be based on silicon or germanium substitutions in diamond, or other systems, and NV diamond is chosen for convenient illustration. NV diamond spin qubits provide a number of quantum states that can be used for quantum computation. NV and SiV centers are referred to as being at or on a front side or device side of a substrate for convenience although they are implanted somewhat below (~50-200 nm) the device side. Major surfaces of substrates are processed such as larger area wafer surfaces and are referred to herein simply as back side surface and a device side (or front side) surface. The examples above pertain to SMR devices but other devices that require thin diamond and for which narrow color center linewidth is preferred can be provided.

The examples discussed above pertain generally to diamond substrates with implanted NV or SiV centers. However, other substrates can be subjected to thinning and soft graded etching as described herein. Example substrates includes include silicon, sapphire, quartz, GaAs or any other III/V or II/VI semiconductor, glass, and fused silica.

The disclosed techniques (graded etching and thinning) are applicable individually and any combination to arbitrary substrates with selection of suitable etching conditions. The disclosed approaches are particularly suited to applications in which a substrate back side should exhibit low damage and the substrates are thinned to have thickness less than 100, 200, 250, 500, 1,000, 2,000, or 2,500 nm. NV centers can exhibit full width at half maximum linewidths after graded etching of less than 1 GHz, 750 MHz, 500 MHz, or 250 MHz. Substrate thickness variations in an active region can be less than 10 nm, 25 nm, 50 nm, 100 nm, or 250 nm. As discussed above, a graded soft etch generally uses etch rates that step down gradually or step-wise and a final step or steps can etch so slowly that substrate thickness changes are very small (less than a few nm).

In view of the many possible embodiments to which the principles of the disclosed technology may be applied, it should be recognized that the illustrated embodiments are only preferred examples and should not be taken as limiting the scope of the disclosure. We claim all that comes within the scope and spirit of the appended claims.

We claim:

1. A method of thinning a device substrate, comprising:
situating a mask substrate to be displaced from and facing a back side of the device substrate, the mask substrate defining an aperture corresponding to an area of the back side of the device substrate to be thinned;
exposing the back side of the device substrate to an etch through the aperture defined in the mask substrate, wherein the device substrate is a diamond substrate;
defining a phononic crystal on a front side on the diamond substrate; and
defining a plurality of surface mechanical resonators (SMRs) on the front side of the diamond substrate, the SMRs including one or more color centers.

2. The method of claim 1, wherein the etch is one or more of a reactive ion etch (RIE) and an inductively coupled plasma (ICP) etch.

3. The method of claim 1, wherein at least a portion of the etch includes a simultaneous RIE and ICP etch.

4. The method of claim 1, wherein the color centers are nitrogen vacancy (NV) centers or silicon vacancy (SiV) centers, or a combination thereof.

5. The method of claim 4, wherein the mask substrate is displaced from the diamond substrate a distance of between 50 μm and 250 μm during back side etching.

6. The method of claim 5, further comprising situating a spacer between the mask substrate and the back side of the device substrate and contacting the mask substrate and the back side of the device substrate so that the mask substrate is displaced from the back side of the diamond substrate.

7. The method of claim 6, wherein the spacer has a thickness of between 50 μm and 250 μm.

8. The method of claim 1, wherein the mask substrate is a sapphire substrate.

9. The method of claim 1,
wherein the etch applied to the back side of the device substrate is a graded soft etch.

10. The method of claim 9, wherein the device substrate is a diamond substrate, and further comprising:
forming a plurality of nitrogen vacancy (NV) centers on a front side of the diamond substrate; and
applying the graded, soft etch to the back side of the diamond substrate to reduce a linewidth associated with the plurality of NV centers.

11. The method of claim 9, wherein the graded soft etch is a stepwise graded etch.

12. The method of claim 9, wherein the graded, soft etch includes at least an initial etch step having an etch rate of at least 5 nm/min.

13. The method of claim 9, wherein the graded, soft etch is a stepwise graded inductively coupled plasma (ICP) $O_2$ etch including at least an initial etch step at an initial ICP power level to produce an initial etch rate greater than 5 nm/min applied for an initial exposure time of at least 30 minutes and a final etch step at a final ICP power level that is less than ⅓ of the initial power level applied for a final exposure time of less than 15 minutes.

14. The method of claim 13, wherein the stepwise etch further comprises:
   a first etch step applied after the initial etch, the first etch step associated with a first power level and a first etch rate of less than ¼ of the initial etch rate for a first exposure time of less than ½ of the initial exposure time; and
   a second etch step applied after the first etch and prior to the final etch step, the second etch step associated with a second power level and a second etch rate that is less than the first etch rate for a second exposure time of less than ½ of the first exposure time.

15. The method of claim 9, wherein the graded, soft etch is a stepwise graded ICP $O_2$ etch that includes a series of etch steps associated with decreasing ICP powers.

* * * * *